United States Patent [19]
Marshall et al.

[11] Patent Number: 5,831,596
[45] Date of Patent: Nov. 3, 1998

[54] JOYSTICK CONTROLLER USING MAGNETIC POSITION SENSORS AND A RESILIENT CONTROL ARM WITH SENSOR USED TO MEASURE ITS FLEX

[75] Inventors: Steven Marshall, Treharris; Alfred J. Alexander, Rochester; Mufti M. Ashraf, Hengoed, all of United Kingdom

[73] Assignee: Penney & Giles Blackwood Limited, England

[21] Appl. No.: 313,026

[22] PCT Filed: Mar. 22, 1993

[86] PCT No.: PCT/GB93/00581

§ 371 Date: Nov. 25, 1994

§ 102(e) Date: Nov. 25, 1994

[87] PCT Pub. No.: WO93/20535

PCT Pub. Date: Oct. 14, 1993

[30]     Foreign Application Priority Data

Mar. 25, 1992 [GB] United Kingdom .................. 9206447
Aug. 21, 1992 [GB] United Kingdom .................. 9217778
Dec. 1, 1992 [GB] United Kingdom .................. 9225072

[51] Int. Cl.⁶ .................................................. G09G 5/08
[52] U.S. Cl. ...................................... 345/161; 74/471 XY
[58] Field of Search ....................... 345/161; 74/471 XY; 273/148 R; 436/36, 37, 38

[56]         References Cited

U.S. PATENT DOCUMENTS 4,348,142  9/1982  Figour ................................ 74/471 XY
4,459,578  7/1984  Sava et al. ............................... 345/161
4,492,830  1/1985  Kim ............................................ 463/38
4,500,867  2/1985  Ishitobi et al. .......................... 345/161
4,533,899  8/1985  Isaksson .............................. 74/471 XY
4,688,444  8/1987  Nordstrom .......................... 74/471 XY
4,748,441  5/1988  Brzezinski .
4,825,157  4/1989  Mikan ................................. 74/471 XY
5,160,918  11/1992  Saposnik et al. ....................... 345/161
5,168,221  12/1992  Houston .................................. 345/161

FOREIGN PATENT DOCUMENTS 151479   8/1985  European Pat. Off. .
447334   9/1991  European Pat. Off. .
2211280  6/1989  United Kingdom .

Primary Examiner—Steven Saras
Assistant Examiner—Paul A. Bell
Attorney, Agent, or Firm—Andrus, Sceales, Starke & Sawall

[57]              ABSTRACT

A joystick controller has a body 12 including an end wall 18 in which is secured a resilient arm 10. The resilient arm 10 has secured to its top a tube 90 and a handle 94. The tube 90 surrounds to arm and mounts an annular magnet 38 at the level of a pivot point 96 about which the arm 10 flexes. The outputs of Hall effect probes 26 are affected by the position of the magnet 38 to give an indication of the position of the arm 10. The angular position of a rotary handle 80 is sensed using a magnet 110 which is connected for movement with the handle 80 relative to further Hall effect probes 116 (FIG. 9).

11 Claims, 8 Drawing Sheets

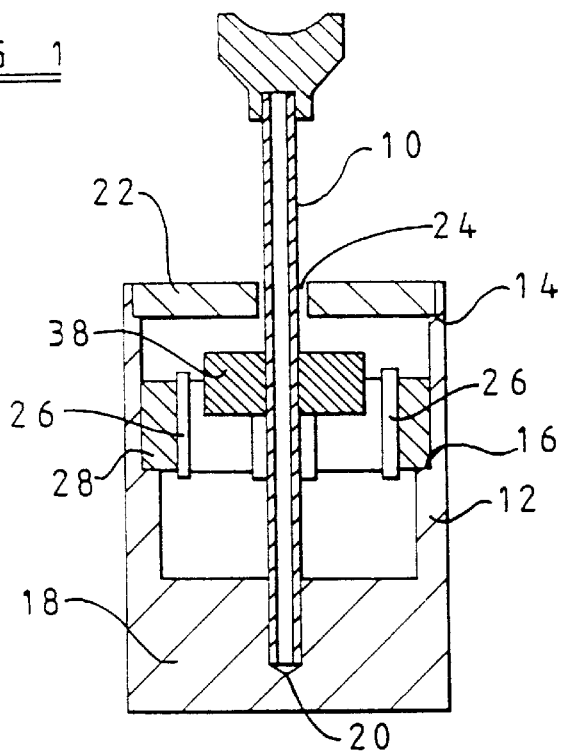
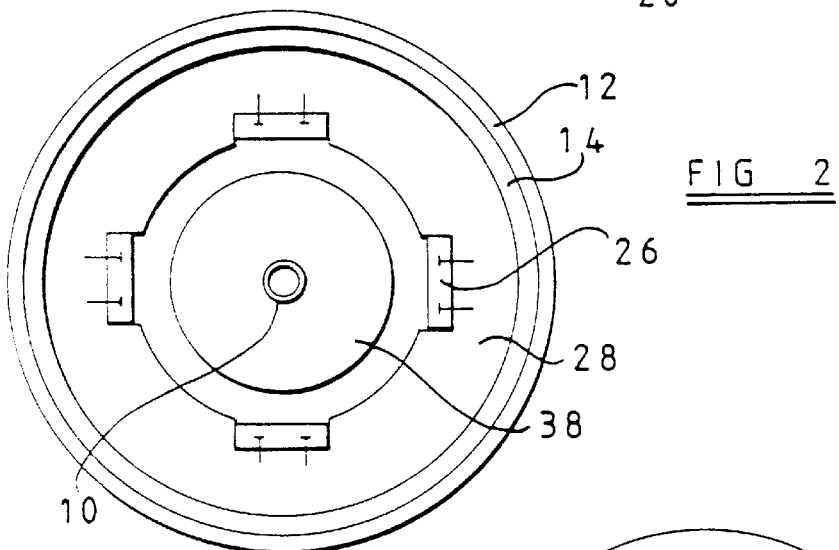
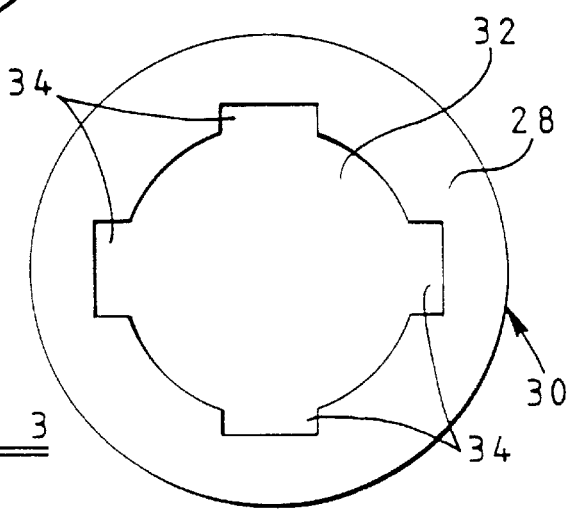

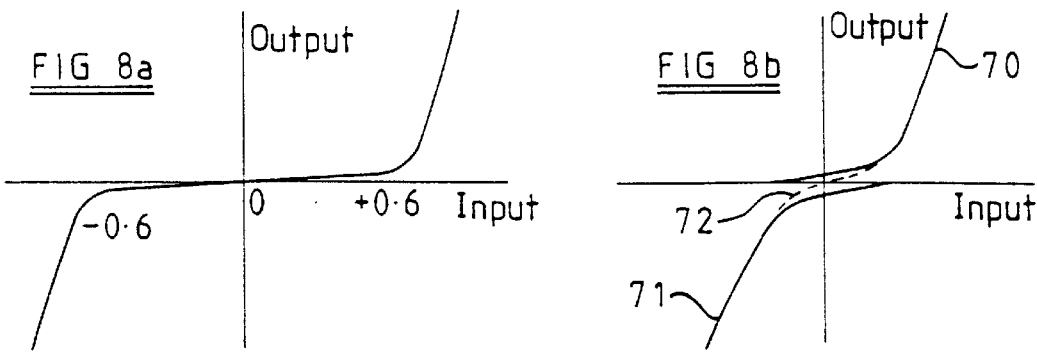
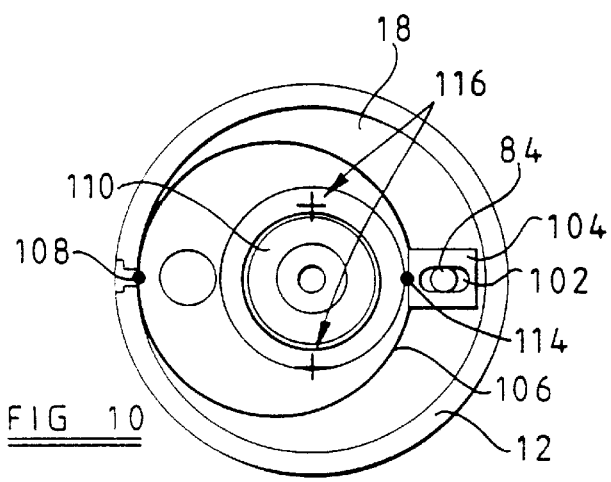
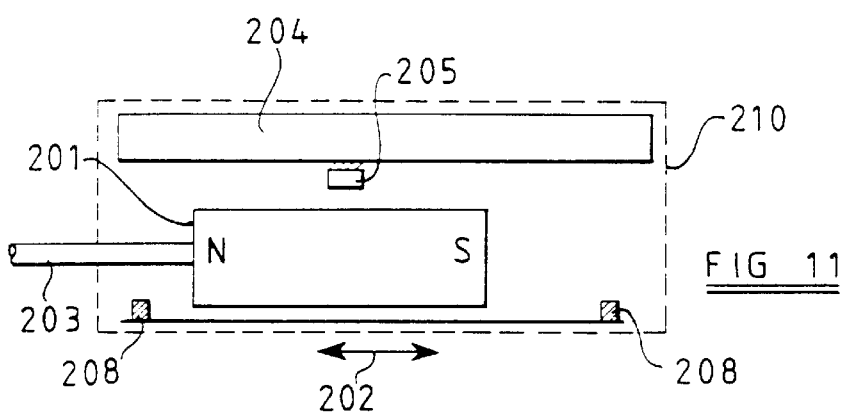
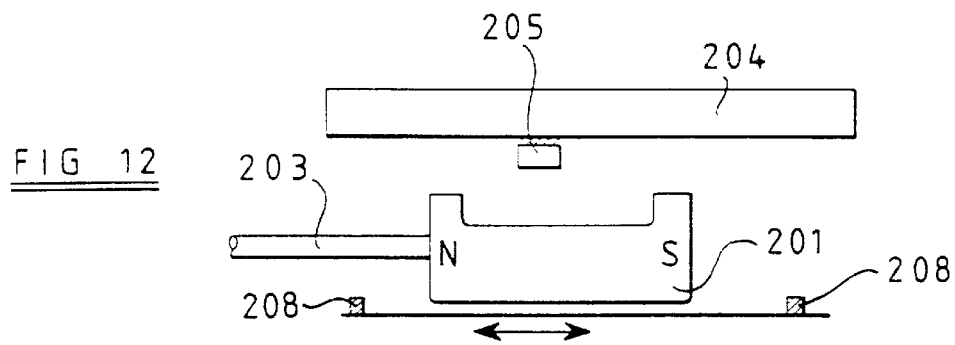

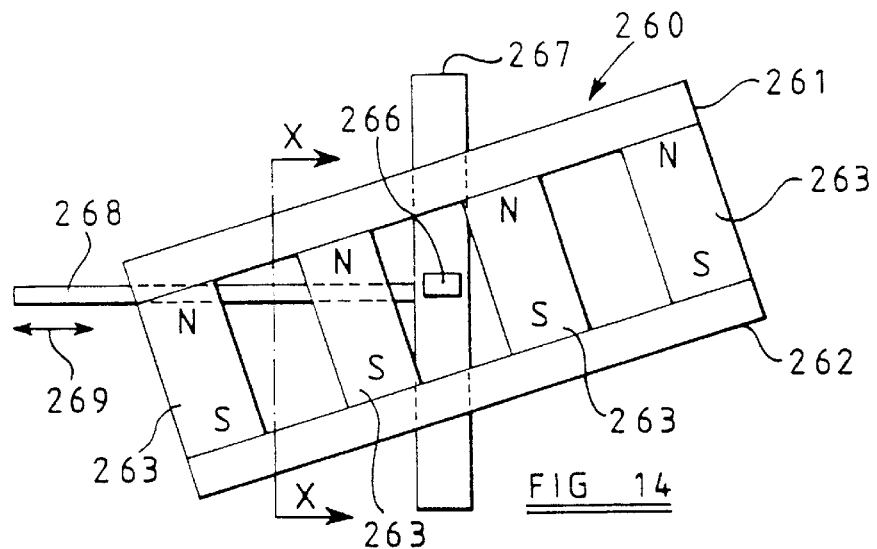
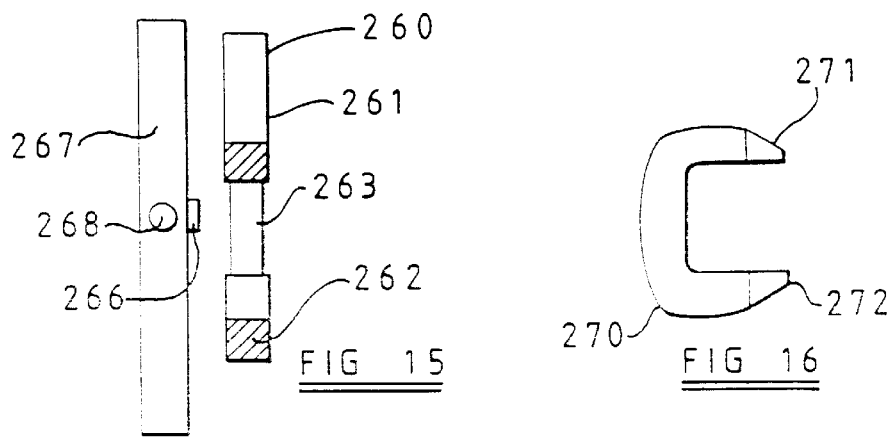
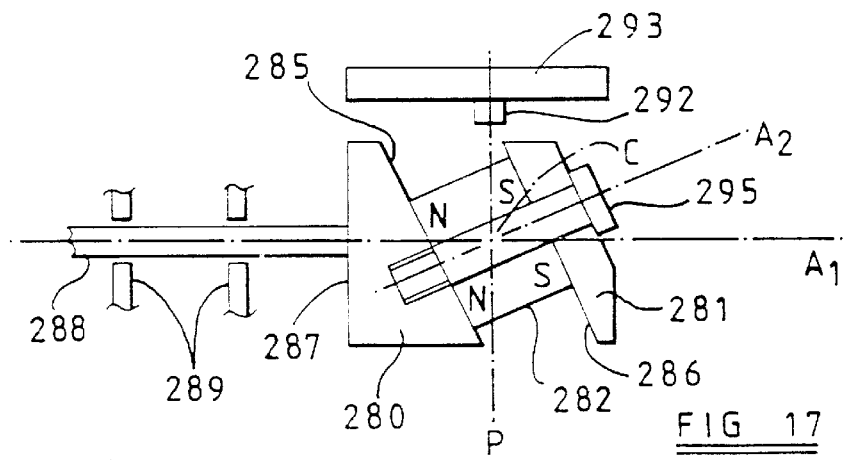

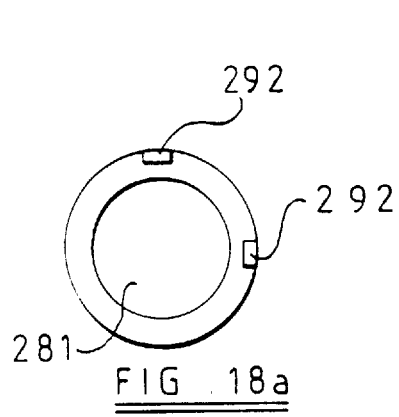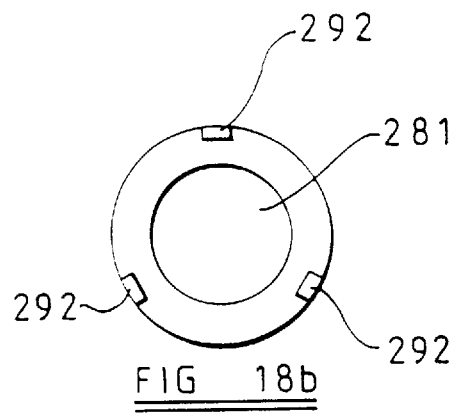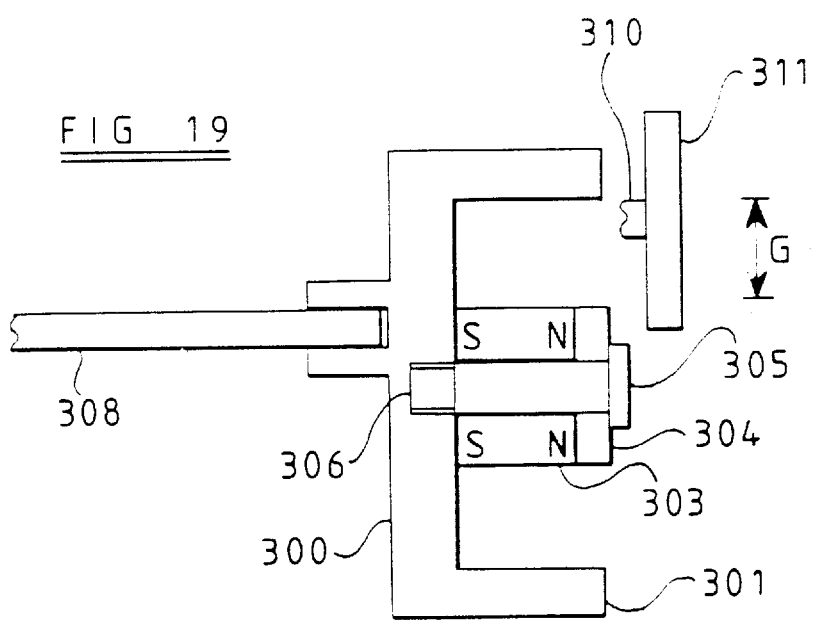

JOYSTICK CONTROLLER USING MAGNETIC POSITION SENSORS AND A RESILIENT CONTROL ARM WITH SENSOR USED TO MEASURE ITS FLEX

BACKGROUND OF THE INVENTION

This invention, in its first aspect, relates to a controller of the type including a control arm to which an external force is applied, and measurements of the movement of the control arm in response to the applied force are used to control other apparatus.

In some controllers, a rigid control arm is pivotally mounted upon a body and biased towards a centre position by a spring or springs. When a force is applied to the control arm, the spring(s) allow(s) the control arm to pivot with respect to the body. The position of the control arm is determined using the output of switches, potentiometers or other sensors which are positioned around the control arm. When the force is removed, the control arm returns to its original position under the action of the spring(s).

In other controllers, a rigid control arm, having at its top a knob which is held between the fingers, is mounted on a base. A number of strain gauge elements are positioned around the control arm and arranged to measure any strain applied to the control arm. The control arm is rigidly attached to the base and scarcely flexes or moves with respect to the base when a force is applied to the control arm (the maximum amount of permitted movement at the knob is typically as little as 0.05 mm, and therefore the arm essentially feels rigid). These types of controller lack "feel" and it is therefore difficult to exercise the required control accurately. Furthermore, it is difficult to ensure that the output of the controller corresponding to the centre position is consistent every time that the external force is removed.

BRIEF SUMMARY OF THE INVENTION

According to a first aspect of the present invention there is provided a controller comprising a resilient control arm arranged to flex under the action of an applied force, and at least one sensor for measuring the flexure of the control arm.

The amount of permitted flexure at that part of the arm which is held in use is usually at least 1 mm (and is preferably about 5 to 7 mm) in order to give the required sense of movement when the arm is flexed.

Said at least one sensor preferably includes a sensor member which is mounted for movement with the control arm on a tube which is secured to the control arm at or near to a part of the latter which is held in use.

In a preferred embodiment, said sensor member is arranged to tilt about a point intermediate the ends of the control arm. Preferably, the point is located within the volume of the sensor member, and more preferably is located substantially at the centre of the sensor member.

Preferably, means are provided for limiting flexing movement of said resilient control arm about said pivot point. Most conveniently, said means for limiting flexure of the resilient control arm comprises a tapered wall of a body member relative to which the resilient control arm can flex.

Preferably the controller further comprises a support. The control arm may be rigidly connected to the support. The control arm is arranged to return to a first position when an applied force is removed from the control arm.

Preferably the controller further comprises processing means, responsive to the at least one sensor, for providing a signal dependent on the flexure of the control arm. The processing means may have a non-linear transfer function. The signal may be substantially proportional to the flexure of the control arm. Alternatively the signal may be held at a first predetermined value until the control arm has been flexed by a predetermined amount. The signal may then deviate from the first predetermined value by an amount dependent upon the amount of flexure in excess of the predetermined amount. Alternatively the signal may change abruptly to a second or further predetermined value in response to flexure of the control arm in excess of the predetermined amount.

As a further alternative, a region of reduced sensitivity may be provided so that the signal changes by a reduced amount for a given change in flexure of the control arm until the magnitude of the flexure exceeds a first threshold, changes in flexure greater than the first threshold giving rise to a correspondingly larger change in the signal. Thus, it is possible to provide a controller having, for example, a dead-zone or a zone of reduced sensitivity, for example, about the first position.

The first predetermined value may be zero volts (with respect to a reference, such as ground) or zero current.

Preferably, said at least one sensor comprises a magnet and a sensor element responsive to a magnetic field. The sensor element may be a magneto-resistive element or a magneto-optic element, but preferably the sensor element operates using the Hall effect principle, for instance a semiconductor Hall effect probe. The magnet and the sensor element are arranged such that flexure of the control arm causes relative movement between the magnet and the sensor element. Preferably the magnet is movable with the control arm. A single magnet may be used with a plurality of sensor elements to form a plurality of sensors. The control arm may act as the magnet.

As an alternative the at least one sensor may be a wire strain gauge. The or each strain gauge is attached to the control arm, parallel to the longitudinal axis thereof, and extending over a substantial portion of the control arm. The at least one wire strain gauge may, for example, be several centimetres long.

As a further alternative a switch may be used as a sensor. The switch may operate as a result of abutment with the control arm, alternatively the switch may be responsive to a magnetic field.

The control arm may be tubular or, more preferably, in the form of a solid rod. The control arm may be resilient metal, for example a cold rolled beryllium copper alloy or cold worked stainless or spring steel.

The shape of the control arm may be such that the stiffness of the control arm varies with the direction of flexure, giving the control arm a "preferred axis" feel. The preferred axis feel may, for example, be achieved by using a control arm having a rectangular or elliptical cross-section.

Preferably the controller has four sensor elements spaced substantially equally around the control arm, opposing sensor elements being grouped together to measure flexure along an axis, for example by taking the difference between the outputs of each sensor elements in a group to give an indication of magnitude and direction of flexure of the control arm along an axis. Preferably each group has an associated processing means. It is thus possible to provide a controller in which the flexure of the control arm can be resolved into two orthogonal components. Consequently, the force applied to the control arm may be resolved into orthogonal lateral components.

The controller preferably further includes at least one manually operable member which is movable independently of the control arm, and at least one further sensor for measuring movement of said at least one manually operable member whereby at least one additional parameter can be controlled by the controller. Preferably, said at least one further sensor comprises at least one magnet and at least one sensor element responsive to a magnetic field arranged such that movement of said at least one manually operable member causes relative movement between the at least one magnet and the at least one sensor element. The sensor element may be a magneto-resistive element, but preferably the element operates using the Hall effect principle, for instance a semi-conductor Hall effect probe.

Conveniently, said body member mounts said at least one manually operable member for angular movement relative thereto about the longitudinal axis of the resilient control arm. By the term "longitudinal axis of the resilient control arm" is meant the longitudinal axis thereof when the control arm is at rest, i.e., when it is not in a flexed condition.

According to a second aspect of the present invention, there is provided a displacement transducer comprising a magnet, a magnetic sensor sensitive to magnetic flux or magnetic field and an input member arranged such that movement of the input member causes relative movement of the magnetic sensor and the magnet, the magnetic sensor having an output which is continuously variable for indicating the position of the input member.

Most preferably the polarity and magnitude of the output of the magnetic sensor is dependent on the position of the input member. The magnetic sensor may have differential outputs and an output may be formed by taking the difference between the differential outputs.

Advantageously, the displacement transducer further comprises a pole piece disposed to affect the spatial distribution of the magnetic flux or magnetic field of the magnet. The pole piece may be shaped to give a predetermined flux or field distribution. The pole piece may have a unitary or a modular construction. Further pole pieces may also be provided, and the or each further pole piece may have a similar construction to the first pole piece.

The magnet may be constituted by a magnet assembly comprising a plurality of magnets and pole pieces arranged such that the magnet assembly has North and South magnetic poles.

The displacement transducer may be arranged to measure translational displacement and the input member may be translationally displaceable. Alternatively, the displacement transducer may be arranged to measure rotational displacement and the input member may be rotatable. As a further alternative, the input member may be a control arm (eg a joystick of a manually operable joystick controller) which is capable of pivotal or flexural movement.

Preferably the magnetic sensor is a Hall effect sensor. Alternatively magnetic sensors using other magneto-physical phenomena, such as magneto-resistive, magneto-optic or magnetostrictive effects, may be used.

Preferably the magnetic sensor is arranged to measure magnetic flux or magnetic field having a component perpendicular to an axis connecting magnetic poles of the magnet.

It is thus possible to provide a displacement transducer in which the operational range of relative movement between the magnetic sensor and the magnet is substantially from one magnetic pole to the other.

BRIEF DESCRIPTION OF THE DRAWING

The invention will further be described by way of example with reference to the accompanying drawings, in which:

FIG. 1 is a sectional view through an embodiment of a controller according to the first aspect of the present invention and which also embodies a transducer according to the second aspect of the present invention;

FIG. 2 is a plan view of a base of the embodiment of FIG. 1 viewed from the open end of the base;

FIG. 3 is a plan view of a support ring for use in the embodiment of FIG. 1;

FIGS. 8a and 8b are examples of the transfer functions available from the circuit shown in FIG. 7;

FIG. 10 is a section on the line A—A of FIG. 9;

FIG. 11 is a schematic illustration of a linear displacement transducer constituting another embodiment of the second aspect of the present invention;

FIG. 12 is a schematic illustration of a linear displacement transducer constituting another embodiment of the second aspect of the present invention;

FIG. 14 is a schematic illustration of linear displacement transducer constituting a further embodiment of second aspect of the present invention;

FIG. 15 is a view along the section X–X' of FIG. 14;

FIG. 16 is a cross-sectional view of a magnet arrangement suitable for use with the transducer shown in FIG. 14;

FIG. 17 is a schematic illustration of a rotary displacement transducer constituting a still further embodiment of the second aspect of the present invention;

FIGS. 18a and 18b show plan views of sensor arrangements suitable for use with the transducer shown in FIG. 17;

FIG. 19 is a schematic illustration of a rotary displacement transducer constituting another embodiment of the second aspect of the present invention;

DESCRIPTION OF THE PREFERRED EMBODIMENTS

Figure 4:
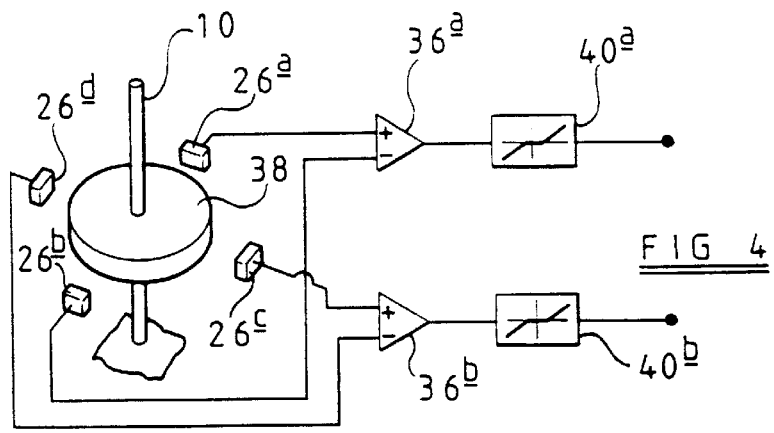
FIG. 4 is a schematic circuit diagram of a processing circuit for use with the embodiment of FIG. 1.

Referring now to FIGS. 1 to 3 of the drawings, there is illustrated a joystick controller comprising a resilient control arm 10 which is rigidly attached to a support defined by a body 12. The body 12 takes the form of a hollow cylinder one end of which is open. The internal diameter of the body 12 decreases in steps 14, 16 from the open end of the body 12 to the closed end thereof in such a manner that when the body 12 is viewed from its open end, the steps 14, 16 appear as a series of concentric rings on planes parallel to the plane of the open end of the body 12.

The closed end of the body 12 is defined by an integral wall 18 which includes a generally cylindrical recess 20. The diameter of the recess 20 is such that the control arm 10 is firmly fixed therein. It may be desirable or necessary to introduce some adhesive into the recess 20 before inserting the control arm 10 so as to ensure a firm and rigid engagement between the control arm 10 and the body 12.

The open end of the body 12 is closed by a lid 22 which includes an aperture 24 through which the control arm 10 extends, the lid 22 being supported by one of the steps 14 formed on the inner surface of the body 12 and gripped by the wall of the body 12. The aperture 24 in the lid 22 is of a larger diameter than that of the control arm 10 and hence movement of the control arm 10 with respect to the body 12 between predetermined limits is allowed, further movement of the control arm 10 being restricted by engagement of the control arm 10 with the walls of the aperture 24 in the lid 22.

The control arm 10 takes the form of a generally cylindrical beryllium copper alloy tube, the ends of which are sealed. The end of the control arm 10 which is attached to the body 12 is solid so as to prevent that part of the control arm from collapsing and being released from within the recess. Since one end of the control arm 10 is rigidly attached to the body 12 of the controller, if an external force is applied to the control arm 10 and the body 12 held still, the control arm 10 flexes. The construction of the control arm 10 allows a limited amount of flexure of the control arm 10 (typically 5 to 7 mm at the top of the control arm, i.e. that part which is held between the fingers in use) following the application of an external force giving the controller a positive feel. When the external force is removed, the resilient nature of the control arm 10 causes the latter to return to its original position.

The position of the control arm 10 is detected by four Hall probes 26 (typically type no. UGN 3503 UN made by Allegro Microsystems) which are housed within the body 12. The Hall probes 26 are mounted on a support ring 28 which is supported by one of the steps 16 formed on the inner surface of the body 12. The support ring 28, shown in FIG. 3, includes a circular outer periphery 30 for engagement with the inner surface of the body 12, and a generally cruciform inner aperture 32. A Hall probe 26 is supported in each end region 34 of the generally cruciform aperture 32 and the electrical leads for each Hall probe 26a–26d are connected to the input terminals of an electronics unit.

The Hall probes 26 are arranged to monitor the magnetic field strength at positions within the body 12. An annular magnet 38 is carried by a portion of the control arm 10 within the body 12. Thus, when the control arm 10 is moved, the magnetic field strength detected by at least one of the Hall probes 26 varies.

The Hall probes are typically commercially available integrated circuits comprising Hall element, control current source and differential buffer amplifier. A constant current is applied to the Hall element by the current source. A current flows through each Hall element in a direction generally perpendicular to the direction of the magnetic field. The magnetic field strength causes a potential difference across the Hall element and in a direction perpendicular to both the direction of current flow and the magnetic field. The differential voltage across each Hall element is fed to the differential buffer amplifier which drives the Hall probe output signal. The output voltage from each of the Hall probes 26a–26d may be measured with respect to a convenient voltage, such as 0 volts, by grounding a suitable terminal of each Hall probe 26a–26d. The output voltages from each of the Hall probes is fed to a processing unit.

A processing circuit is shown in FIG. 4. The processing circuit is divided into two channels designated a and b.

The outputs of opposed Hall probes 26a and 26b are connected to the non-inverting and inverting inputs respectively of an operational amplifier 36a.

The outputs of opposed Hall probes 26c and 26d are connected to the non-inverting and inverting inputs of an operational amplifier 36b. The output of the operational amplifier 36a is connected to an input of a shaping circuit 40a. Similarly, the output of the operational amplifier 36b is connected to an input of a shaping circuit 40b.

The operational amplifiers 36a and 36b form the difference between the voltages at their respective inputs. Thus, for example, the output of the operational amplifier 36a is a positive voltage for movement of the control arm 10 towards the Hall probe 26a, whilst the output voltage is negative for movement of the control arm 10 towards the Hall probe 26b. The outputs of the operational amplifiers should be substantially 0 volts for the control arm 10 at the centre position. Each operational amplifier 36a and 36b may be trimmed, for example by use of offset null pins commonly provided on operational amplifiers, to achieve a substantially zero output when no force is applied to the control arm 10.

Figure 5:
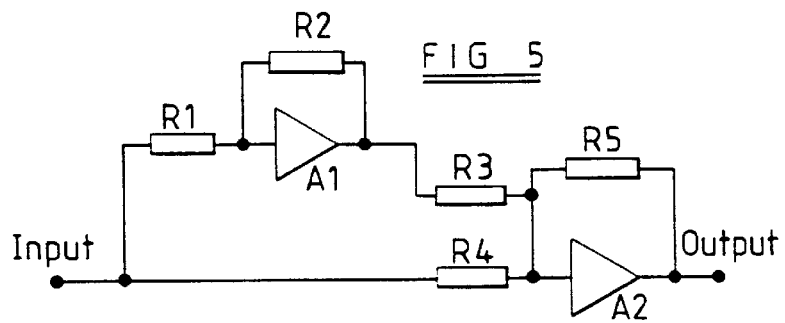
FIG. 5 is a circuit diagram of a shaping circuit suitable for producing a "dead-zone" in the transfer function of a controller.

A shaping circuit 40a, 40b is shown in FIG. 5. The input voltage is fed to first and second operational amplifiers A1 and A2. The first operational amplifier acts as an inverting amplifier having a gain, -G, set by the ratio of R2 to R1. The second operational amplifier acts as a summer. By setting R2/R1 equal to R3/R4 the input signal is nulled by the output of A1 until A1 saturates.

Thus, over a range of input voltages, the output of A2 remains substantially 0 volts. The gain -G, of the first operational amplifier A1 is chosen to be large. Consequently A1 saturates for relatively modest input voltages. Once saturation of A1 has occurred, the nulling action cannot be maintained and the output voltage of A2 changes linearly with changes in the input voltage. Thus a transfer function having a dead zone, as diagrammatically represented in part of FIG. 4, can be achieved. The provision of a "dead zone" enables small variations in the centre position of the control arm 10 to be accommodated without producing a non-zero output. The dead zone can be converted to a range of reduced sensitivity by adjusting the ratio R2/R1 to be less than R3/R4. R5 controls the gain of the second operational amplifier A2.

Since four Hall probes 26 are arranged around the control arm 10 of the controller, movement of the control arm 10 in any direction perpendicular to the axis of the body 12 can be detected accurately. It will be understood that in other embodiments, a different number of Hall probes may be used. For example two Hall probes may be sufficient to resolve the movement of the control arm 10 into two orthogonal components.

In further embodiments, the position of the control arm 10 may be detected using one or more magnets attached to the control arm as in the above embodiment, and the magnetic field strength measured by measuring the resistance of a magneto-resistive material supported within the body. Other methods of detecting the position of the control arm include using strain gauges mounted on the control arm itself so that flexing of the latter causes mechanical forces to be applied to the strain gauges.

Figure 6:
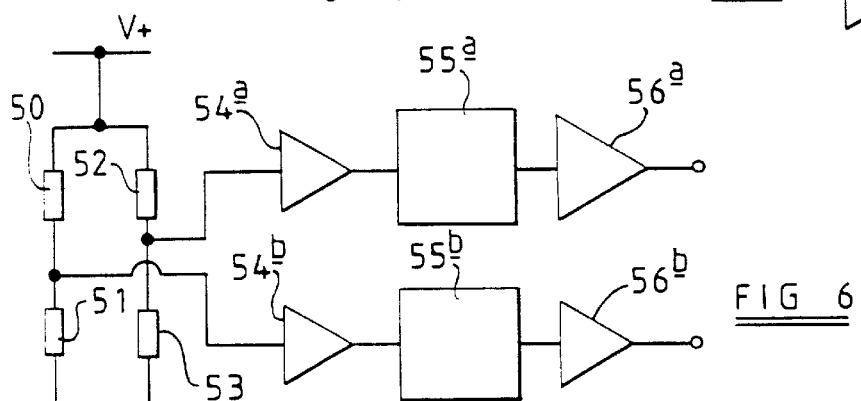
FIG. 6 is a schematic diagram of an alternative processing circuit for the embodiment of FIG. 1.

FIG. 6 shows a schematic circuit diagram for use with sensors arranged in a bridge. The sensors 50–53 may, for example, be strain gauges or magneto-resistive elements. The sensors 50 and 51 form a potential divider, the output of which is supplied to an amplifier 54b. The amplifier 54b may include level shifting components (not shown) to enable the output thereof to be set to a desired value when no force is applied to the control arm 10. The output of the amplifier 54b is fed to an input of a shaping circuit 55b. An output of the shaping circuit 55b is connected to a buffer amplifier 56b. Sensors 52 and 53 are similarly connected to an amplifier 54a, a shaping circuit 55a and a buffer amplifier 56a.

Figure 7:
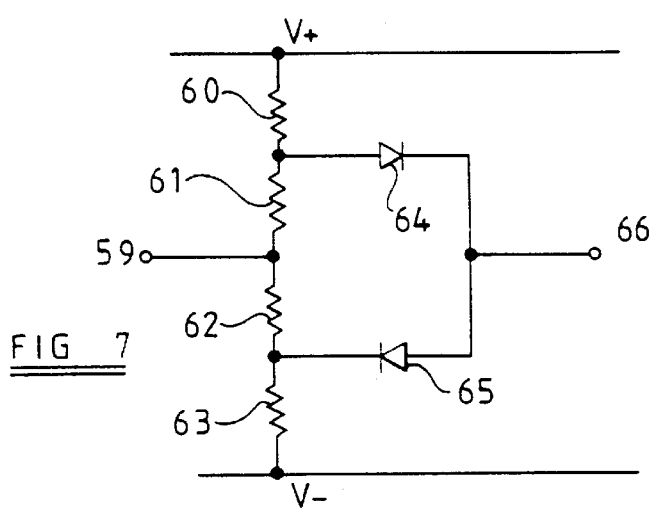
FIG. 7 is a circuit diagram of a circuit suitable for shaping the response of the processing circuit.

FIG. 7 shows an embodiment of a circuit suitable for use as a shaping circuit 55a, 55b. Resistors 60 to 63 are connected in series between two supply rails V+ and V−. An input 59 is connected to a node joining resistors 61 and 62. The anode of a first diode 64 is connected to a node joining resistors 60 and 61. The cathode of a second diode 65 is connected to a node joining resistors 62 and 63. The cathode of the first diode 64 is connected to the anode of the second diode 65 and to an output 66 of the shaping circuit. It may be advantageous to follow the shaping circuit of FIG. 7 with an amplifier having a modest input impedance.

The shaping circuit utilises the diode characteristics of the two diodes 64 and 65 to provide reduced sensitivity over a predetermined range of input voltages. The diodes 64 and 65 are configured such that the shaping circuit can respond to input voltages varying about a predetermined level, for example zero volts. It is well known that a silicon diode remains essentially non-conducting when forward biased until the voltage across the diode reaches about 0.6 V. Thus in the absence of resistors 60 and 63 substantially no signal will be seen at the output 66 until the input 59 has a voltage greater than 0.6 V or less than −0.6 V applied to it.

FIG. 8a shows the transfer function of the shaping circuit of FIG. 7 when resistors 60 and 63 have large values compared to resistors 61 and 62, respectively. The diodes 64 and 65 have a smooth transition from a non-conducting to a conducting state.

It is possible to forward bias the diodes 64 and 65 by suitable selection of the values of the resistors 60 to 63. Reducing the ratio of resistor 60 to resistor 61 raises the voltages at the anode of the diode 64, thereby forward biasing the diode 64. Reducing the ratio of resistor 63 to resistor 62 reduces the voltage of the cathode of the diode 65, thereby forward biasing the diode 65. The onset of conduction for each diode can be moved towards the origin of the graph, thereby reducing the width of the dead band.

As shown in FIG. 8b, it is possible to bias the diodes 64 and 65 so that they have started to conduct when no input signal is applied. The response of the first diode 64 is indicated by the solid line 70. The response of the second diode is indicated by the solid line 71. The transfer function of the shaping circuit is the sum of the individual responses and is indicated by the chain line 72. It is thus possible to generate a transfer function having reduced sensitivity around a position corresponding to the centre position of the control arm 10 and a smooth transition to regions of greater sensitivity.

If wire strain gauges are used, the strain gauges may have an elongate construction, running along a substantial portion of the control arm 10, thereby giving increased sensitivity compared to known strain gauges used in controller applications. If wire strain gauges were substituted for the Hall probes in the embodiments of FIG. 1, the gauges could extend over a substantial portion of the control arm 10 between integral wall 18 and the lid 22. An elongated wire strain gauge is easier to manufacture and gives a higher resistance than a more compact wire strain gauge. A higher resistance is advantageous because it permits a larger voltage to be used and therefore allows a larger output voltage.

Figure 9:
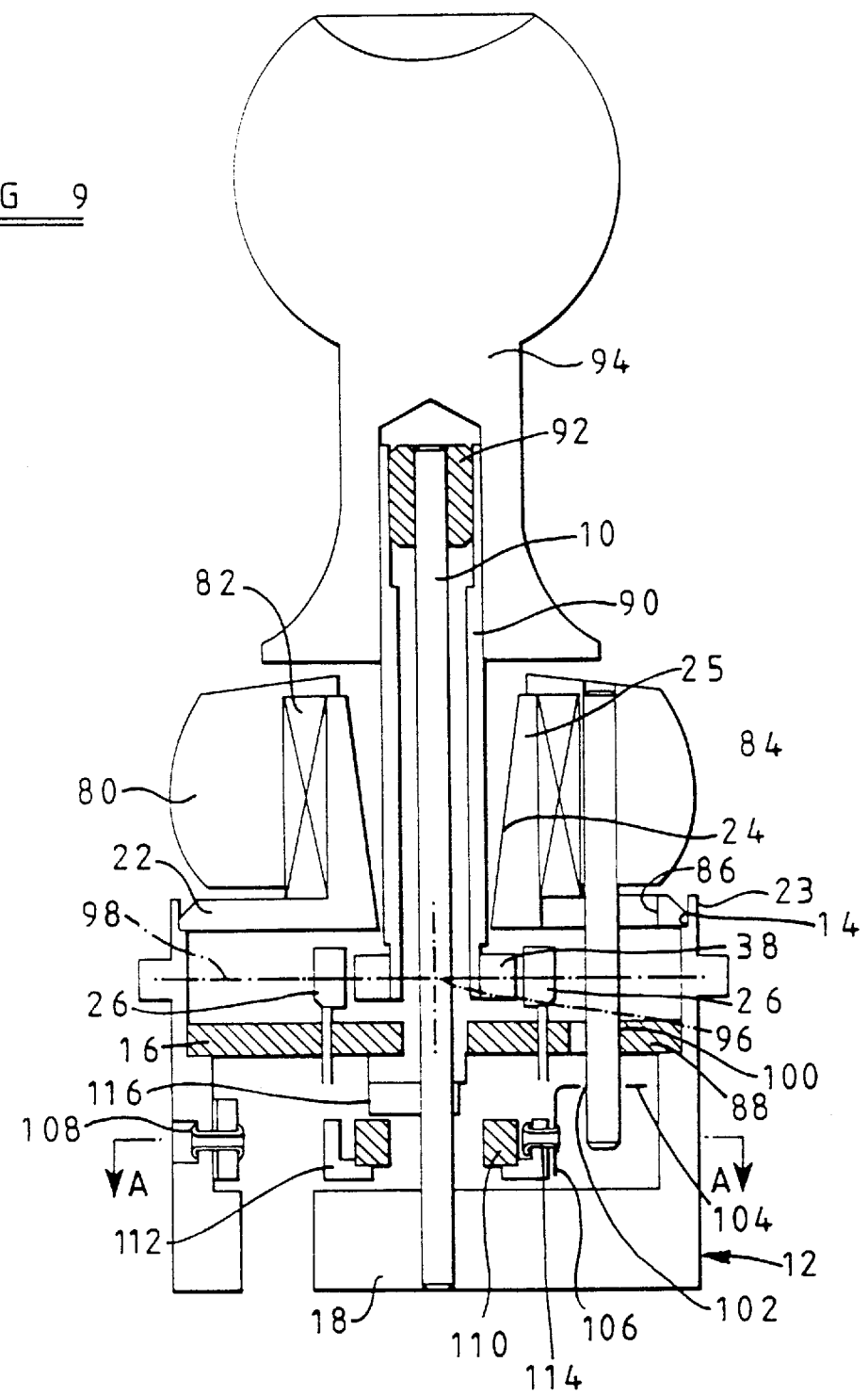
FIG. 9 is an axial section through another embodiment of controller according to the first aspect of the present invention and embodying a transducer according to the second aspect of the present invention.

Referring now to FIGS. 9 and 10, the joystick controller comprises resilient control arm 10 rigidly attached at its lower end (as viewed in the drawing) to a support defined by body 12 having, like that of the controller of FIG. 1, steps 14 and 16 and integral end wall 18 including recess 20 in which the lower end of control arm 10 is firmly fixed. The open end of the body 12 is closed by lid 22 which is secured to the body 12 by peening over a portion 23 of the latter. The lid 22 has aperture 24 through which the control arm 10 extends. In this embodiment, however, the aperture 24 is defined by an upstanding sleeve 25 integral with the lid 22 and having a frusto-conically tapering inner surface wall whose smaller diameter end opens inwardly of the body 12. The sleeve 25 mounts a handle 80 via a bearing 82 so that the handle 80 can be angularly moved about the longitudinal axis of control arm 10 and independently thereof through a restricted arc (in this embodiment about 15° on either side of a rest position).

A connecting rod 84 is mounted in the handle 80 at a location offset from the axis of rotation of the latter and extends into the body 12 through an arcuate slot 86 in the lid 22.

A printed circuit board 88 disposed in the body 12 carries four equally-angularly spaced Hall probes 26 with associated electrical circuitry which can be of any of the types described above in relation to FIGS. 4 to 8.

In this embodiment, annular magnet 38, instead of being directly mounted on flexible control arm 10, is mounted at the lower end of a relatively rigid tube or sleeve 90 which extends through the aperture 24 and up to the upper end of the control arm 10 to be secured to the latter via a brass bush 92. The upper ends of the control arm 10 and sleeve 90 and also the bush 92 are fixedly secured in a bore of a handle 94. Thus, the sleeve 90 is attached to the control arm 10 at a part of the latter which is grasped in use. The sleeve 90 passes with a small clearance through the smaller diameter lower end of aperture 24. The arrangement is such that, when the control arm 10 flexes upon operation of the handle 94, the magnet 38 is tilted about a point 96 which is disposed intermediate the ends of the control arm 10 and between the upper and lower end faces of the magnet 38. In this embodiment, the point 96 is located substantially at the centre of the magnet 38 in a plane 98 passing through the Hall effect probes 26 which are angularly spaced apart on a pitch circle centred on the point 96 so that tilting movement of the magnet 38 occurs relative to the Hall effect probes 26 to produce signals which enable the position of the handle 94 to be detected in any of the manners described above in relation to FIGS. 5 to 8.

The rod 84 passes through an aperture 100 in the printed circuit board 88 so that a lower end of the rod 84 engages in a slot 102 formed in a flange 104 secured to an annular spring 106. The spring 106 is secured by rivet 108 to the side wall of the body 12 at a location which is diametrically opposite the flange 104. An annular magnet 110 is secured to the spring 106 by way of a magnet holder 112 which is firmly fixed to the spring 106 by means of rivet 114 disposed adjacent flange 104.

A pair of further Hall effect probes 116 are supported on the underside of printed circuit board 88 in diametrically opposed relationship on opposite sides of a diametral line joining the rivets 108 and 114.

It will be appreciated from the above that angular movement of the handle 80 will cause the rod 84 to move in an arcuate path centred on the axis of rotation of the handle 80. This coincides with the longitudinal axis of control arm 10 when the latter is at rest. Such movement of the rod 84 occurs parallel to its own longitudinal axis and results in a deflection of the annular spring 106 to one side or other of the natural, at-rest position of the latter (as depicted in FIG. 10). Such movement causes the annular magnet 110 to move nearer to one of the Hall effect probes 116 and further away from the other. In this way, a signal can be derived in a similar manner to that described for one set of the sensors 26 in order to indicate the angular position of the handle 80 about the longitudinal axis of control arm 10.

It will be appreciated that the handle 80 can be operated completely independently of the handle 94 so as to control another parameter. For example, handle 94 may be used to control pan and tilt of a television camera, whilst handle 80 can be used independently to control the degree of zoom of the camera. The tapered aperture 24 provides a very rigid stop for preventing excess flexing of the control arm 10 about pivot point 96.

It will be appreciated that the above-described arrangement enables a linear output to be obtained for each of the two parameters controlled by handle 94 and in respect of the further parameter controlled by angular movement of handle 80.

Referring now to FIG. 11, there is illustrated a linear transducer in accordance with the second aspect of the present invention. Such linear displacement transducer has a magnet 201 arranged to move in the directions indicated by arrow 202 in response to movement of an input shaft 203 of the transducer. The input shaft 203 is connected to the magnet 201. The length of the stroke of the magnet 201, i.e. the amount by which the magnet is moved, is about equal to the length of the magnet 201. The magnet 201 is magnetised such that the axis of magnetisation is parallel to the longitudinal axis of the input shaft 203. The North and South poles of the magnet are denoted by N and S, respectively. The direction of magnetisation of the magnet may be reversed to that shown in FIG. 11.

A pole piece 204 is placed adjacent to and parallel with the magnet 201. The pole piece 204 is arranged such that the pole piece always completely overlaps the magnet 201. The pole piece 204 is made of a magnetically soft material, such as iron or mild steel. A Hall device 205, such as a UGN3503 supplied by Allegro Microsystems Inc, is attached to the pole piece 204 facing but not touching the magnet 201. The Hall device 205 is arranged such that it is overlapped by the magnet 201 at all positions of latter along its stroke. End stops 208 are provided to limit the movement of the magnet 201. Shielding 210 surrounds the transducer substantially to prevent interference from environmental magnetic fields. The shielding is made of a magnetically soft material such as mild steel or mumetal.

The transducer has an approximately linear output versus displacement characteristic. Variations of the characteristic from linear may be produced by reducing or increasing the gap between the pole piece 204 and the magnet 201 at the point where the error occurs.

The magnet 201 may be cylindrical or have square or rectangular cross section. Alternatively a horse shoe magnet, as shown in FIG. 12, may be used. A horse shoe shaped magnet may give a greater flux density and a reduced stray field compared to uniformly shaped magnets.

Figure 13:
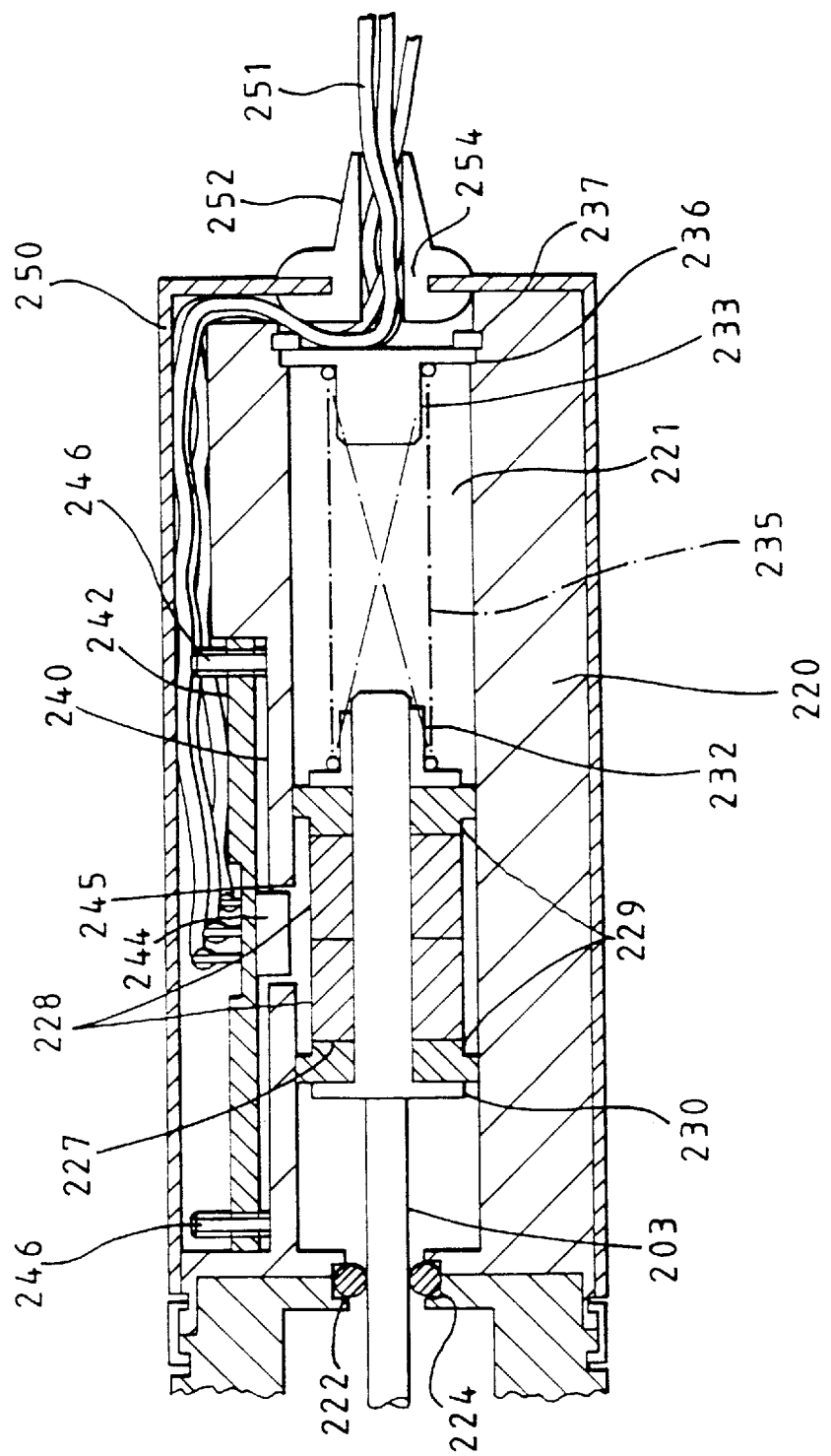
FIG. 13 is a cross sectional illustration of a more practical form of the transducer shown in FIG. 11.

Referring now to FIG. 13, a generally cylindrical body 220, made of a non-magnetic material such as an aluminium alloy, encloses a cylindrical cavity 221. The cavity 221 has an opening 222 at a first end through which the input shaft (push rod) 203 extends. The opening 222 has "O" ring seals 224 to prevent the ingress of dirt and moisture into the cavity 221. The push rod 203 is attached to a first end of a magnet assembly 227 comprising annular magnets 228 sandwiched between annular pole pieces 229 held on a mounting shaft 230. The magnet assembly 227 acts as a magnet and is slidable within the cylindrical cavity 221. A first spring locator 232 is formed at a second end of the magnet assembly 227 and a second spring locator 233 is formed at a second end of the cavity 221. The second spring locator 233 is held against a lip 236 in the body 20 by a circlip 237. A spring 235 is held between the first and second spring locators 232 and 233. The spring 235 urges the magnet assembly 227 to move towards the first-end of the cavity.

A recess 240 is formed in the outer surface of the body 220 and extends parallel to the direction of motion of the magnet assembly 227. The recess 240 extends such that it overlaps the magnet assembly 227 at all positions of the latter along the working stroke of the transducer. A pole piece 242 lies within the recess 240, and extends substantially the entire length of the latter. The pole piece 242 is positioned such that it is substantially parallel to the direction of motion of the magnet assembly 227. A Hall effect sensor 244 is mounted at the centre of the pole piece 242. The Hall effect sensor faces the magnet assembly 227 through an aperture 245 extending from the centre of the recess 240 into the cavity 221. The position of the pole piece 242 may be adjusted relative to the body 220 by grub screws 246 in order to adjust the linearity of the output characteristic of the transducer. Once a satisfactory output is achieved, the pole piece 242 is secured, for example, with adhesive.

A magnetic screen 250 surrounds the transducer. Wires 251 for conducting the power supply to and output signals from the Hall effect sensor 244 are routed towards the second end of the body 220 and through an aperture 254 in the screen 250. A grommet 252 closes the aperture 254 and secures the wires 251 so as to prevent stress in the wires 251 being transmitted to the Hall effect sensor 244.

The magnetic flux path is predominantly from the North pole of the magnet 201, or the magnet assembly 227 of FIG. 13, across the gap to the pole piece, along the pole piece to a position adjacent the South pole of the magnet, and back across the gap to the South pole of the magnet. The magnetic flux density varies longitudinally of the gap between the magnet and the pole piece 204 or 242. Starting next to the North pole of the magnet, the magnetic flux density in the gap is at a maximum. The magnetic flux density decreases along the gap, falling to substantially zero at the mid-point between the poles of the magnet. The magnetic flux density increases again between the mid-point of the magnet and the South pole to a maximum again at the South pole. The direction of the flux between the mid-point and the South pole is reversed to that between the North pole and the mid-point.

The magnetic flux moves as the magnet 201 or magnet assembly 227 moves. The Hall device 205 provides an electrical signal which is dependent upon the magnetic flux density to which it is exposed in the gap between the pole piece and the magnet 201 or magnet assembly 227. The Hall device 205 is able to measure both the magnitude and the direction of the magnetic flux and thereby produce an output which indicates the position of the magnet and thereby the position of the input rod.

The transducer may be modified, for instance the pole piece 242 may be omitted. The magnetic flux will then follow the usual pattern of flux distribution around a magnetic dipole. The pole piece may be shaped to alter the response characteristic of the transducer, for example, to improve the linearity of the transducer.

As the transducer relies on relative movement between the magnet and the magnetic field sensor, ie the Hall effect device, the positions of the magnet and the pole piece and Hall effect device may be transposed. The magnet may be held stationary and the pole piece, having the Hall effect device mounted on it, may be movable in response to the input shaft 203.

The arrangement of the transducer can be modified to provide a displacement transducer with a stroke longer than the pole-to-pole length of the magnet assembly.

FIG. 14 schematically illustrates, in plan view, such a transducer. A magnet assembly 260 comprises first and second elongate pole pieces 261 and 262 separated by magnets 263. The magnets 263 are arranged such that they all have their respective North poles facing the pole piece 261. As illustrated, the magnet assembly 260 is inclined (eg at about 30°) with respect to the path of movement of an input shaft 268, as indicated by arrow 269. A Hall effect device 266, for measuring magnetic flux density, is attached to a third pole piece 267 facing the magnet assembly 260. The third pole piece 267 is attached to the input shaft 268. Axial displacement of the input shaft 268 moves the third pole piece 267 and the Hall effect device 266 with respect to the magnet assembly 260. The movement of the third pole piece 267 is limited by end stops (not shown) such that the third pole piece 267 is overlapped by the first and second pole pieces 261 and 262 throughout the working range of the transducer.

The principle of operation is similar to the previous embodiments. The Hall effect device 266 is arranged to measure the magnetic flux density and its direction in a direction perpendicular to the long axis of the magnet assembly 260, i.e. in a direction perpendicular to the line X–X'. Referring to FIG. 14, when the third pole piece 267 is at the left hand extent of its travel, the Hall effect device is adjacent the pole piece 261 and experiences a magnetic flux density similar to that near the North pole of the embodiment illustrated in FIG. 13. As the third pole piece 267 moves rightwards, the magnetic flux density at the Hall device 266 decreases until the flux density falls to substantially zero when the third pole piece 267 is midway along the magnet assembly 260. This is the position illustrated in FIG. 14. Further movement in a rightwards direction causes the Hall effect device 266 to approach the second pole piece 262. The Hall effect device 266 experiences an increasing flux density as it moves from the mid-point towards the pole piece 262, similar to that near the South pole of the embodiment illustrated in FIG. 13. The direction of the magnetic flux changes at the midpoint.

FIG. 15 shows a view along X-X' of FIG. 14. The Hall effect device 266 lies between the magnet assembly 260 and the third pole piece 267.

In a modification, the third pole piece 267 and the Hall effect device 266 can be held stationary and the input shaft 268 can be arranged to move the magnet assembly 260. This avoids the need for flexible electrical connections to the Hall effect device 266 but results in a bulkier and longer moving assembly. The third pole piece 267 serves to concentrate the magnetic flux at the Hall device 266, but is not essential and may be omitted.

The length of the magnets 263, along the North-South axis, may be tailored to the strength of the magnetic field required. The length of the effective working stroke of the transducer can be adjusted by altering the angle that the magnet assembly 260 makes to the direction of travel of the input shaft 268. The magnet assembly may include a single short but wide magnet, or several magnets 263, for instance four, as illustrated in FIG. 14. The magnets 263 may be evenly spaced. Alternatively non-uniform spacing of the magnets 263 may be utilised to modify the response characteristic of the transducer. For example, the magnets 263 may be concentrated towards the ends of the first and second pole pieces 261 and 262.

The first and second pole pieces 261 and 262 serve to distribute the magnetic flux evenly. The even distribution of the magnetic flux can be improved if the magnets 263 are displaced from the path of the Hall effect device 266, for example by using "C" shaped magnets and having the Hall effect device 266 travel within the gap of the "C". Such an arrangement is shown in cross-section in FIG. 16. "C" shaped magnets can be used in place of the magnets 263 of FIG. 14. First and second pole pieces 271 and 272, respectively, replace the pole pieces 261 and 262 to interconnect the magnets 270.

Shielding, not shown, surrounds the transducer to protect against erroneous measurements being caused by environmental magnetic fields. The shielding also serves to contain the magnetic field produced by the magnets 263 or 270.

The rotary displacement transducer shown in FIG. 17 comprises first and second pole pieces 280 and 281, respectively, at either end of an annular magnet 282. The annular magnet 282 is magnetised so that the magnetic poles are at opposite axial ends thereof. The pole pieces 280 and 281 are cylindrical, of equal diameter and coaxial. The first pole piece 280 has one planar end face 287 disposed in a plane perpendicular to the axis $A_1$ of the cylinder and an opposite planar end face 285 which is inclined with respect to such axis. The first pole piece 280 is axially mounted on one end of a rotary input shaft 288 carried in bearings 289 which prevent axial displacement of the shaft 288. The magnet 282 and second pole piece 281 are secured to the first pole piece 280 by means of a bolt 295 whose axis $A_2$ is inclined and displaced relative to that of the shaft 288 so that the bolt axis $A_2$ intersects the shaft axis $A_1$ at the centre C of the magnet 282.

A Hall effect device 292 is mounted just outside the cylindrical surface in which the peripheral surfaces of the pole pieces 280 and 281 lie. A plane P perpendicular to the axis A1 of the shaft 288 and in which the centre C lies, passes through the device 292.

The Hall effect device 292 may be mounted on a third pole piece 293 which acts to increase the magnetic flux at the Hall effect device 292.

Rotation of the shaft 288 causes respective distances between the Hall effect device 292 and the first and second pole pieces 280 and 281 to change. As illustrated in FIG. 17, the Hall effect device 292 is at a minimum distance from the second pole piece 286. Rotation of the pole pieces 280 and 281 by π radians causes the distance between the Hall effect device 292 and the first pole piece 280 to decrease to a minimum whilst the distance between the Hall effect device 292 and the second pole piece 281 increases to a maximum. Thus the magnet 282 effectively reciprocates cyclically relative to the device 292 thereby causing the output of the device 292 to vary substantially sinusoidally as the shaft 288 rotates.

Additional Hall effect devices can be places around the rotary transducer shown in FIG. 17. Two Hall effect devices 292 can be spaced by π/2 radians around the magnet and pole pieces 280–282, as shown in FIG. 18a. Such an arrangement will produce orthogonal sinusoids in response to rotation of the input shaft 288. Alternatively three Hall effect devices 292 may be evenly spaced around the magnet and pole pieces to provide output signal spaced apart by 120°, as shown in FIG. 18b. Further devices 292 may be positioned to give predetermined phase delays between output signals of the devices 292.

A further embodiment of a rotary position transducer is shown schematically in FIG. 19. A cylindrical cup-shaped pole piece 300 has a rim 301. An annular magnet 303 and a second pole piece 304 are coaxially mounted in the pole piece 300 by means of a bolt 305 engaging a screw threaded recess 306 in the centre of the base of the pole piece 300.

The magnet-remote end surface of the second pole piece 304 lies in substantially in the same plane as the rim 301. The pole piece 300 is attached to a rotatable input shaft 308 whose longitudinal axis is parallel to that of the magnet 303 and second pole piece 304. Thus rotation of the input shaft 308 causes the pole pieces 300 and 304, the rim 301 and the magnet 303 to move eccentrically. The axis of input shaft 308 is offset from that of the pole piece 300 by a distance slightly less than G/2, where G is the distance between the outer surface of the annular pole piece 304 and the inner surface of the rim 301.

A Hall effect device 310 is disposed a short distance outside the pole piece 300 and adjacent a gap between the pole piece 304 and the rim 301. A third pole piece 311 may optionally be positioned adjacent to the Hall effect device 310 and on the opposite side of the latter to the pole piece 300 to concentrate the magnetic field at the Hall effect device 310.

The eccentric rotation of the circular pole piece 300, the rim 301, the magnet 303 and the second pole piece 304 results in a cyclic variation of the distances between the Hall device 310 and the rim 301 and the second pole piece 304, respectively. As the distance between the Hall device 310 and the rim 301 increases, the distance between the Hall device 310 to the second pole piece 304 decreases. The rim 301 acts as a first magnetic pole, for instance a South pole with the magnet 303 orientated as in FIG. 19, while the second pole piece acts as a second magnetic pole, ie a North pole. Thus, there is effectively relative movement between the Hall effect device 310 and the opposing magnetic poles. The magnetic flux varies between the poles as described in the earlier embodiments.

The Hall effect device produces a substantially sinusoidal output in response to rotation of the input shaft 308. The deviation from a true sinusoid may be reduced if the gap width G is small compared with the mean radius of the gap, say less than one fifth of the mean radius. The deviation may be further reduced by inclining the Hall effect device 310 (and the pole piece 311 if it is has been provided) slightly towards the first pole piece 301, for example by 5° for a gap width of 1 mm and a mean radius of 10 mm.

Further Hall effect devices may be used to provide further outputs having predetermined phase differences, as described in FIGS. 18a and 18b with respect to the embodiment shown in FIG. 17.

The static pole pieces associated with the Hall effect devices in each of the rotary transducers may be constructed as a ring substantially coaxial with the rotating parts of each transducer. The use of a ring minimises out-of-balance torques generated by magnetic attraction between the moving pole pieces and the static pole piece.

Figure 20:
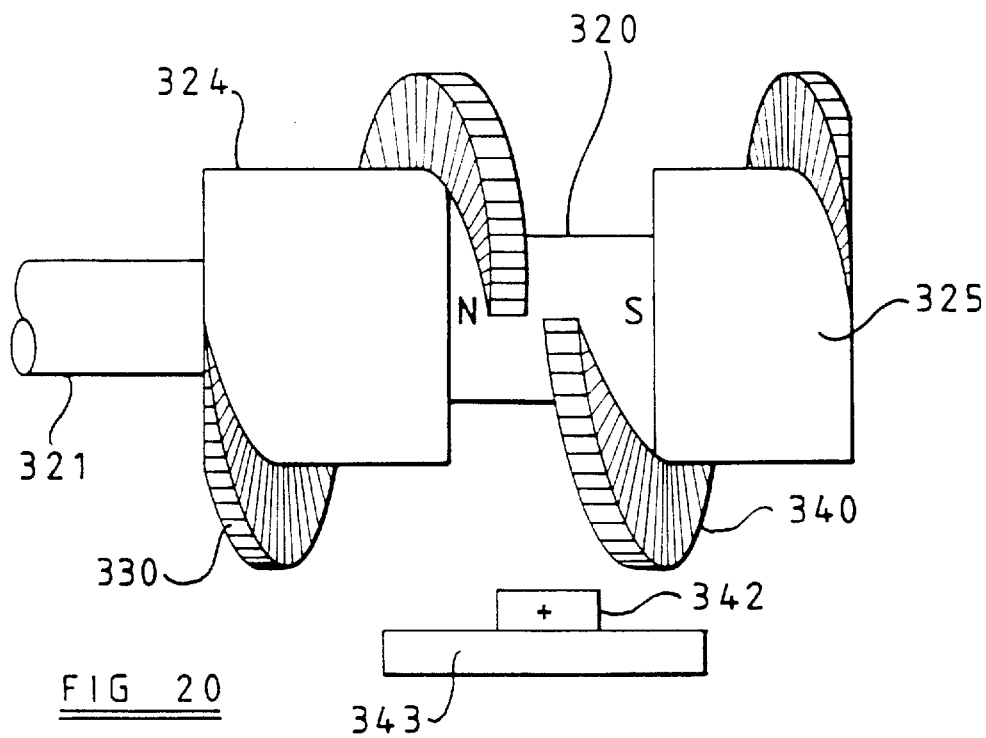
FIG. 20 is a schematic illustration of a rotary displacement transducer constituting a further embodiment of the second aspect of the present invention.

In a further embodiment, as illustrated in FIG. 20, a cylindrical magnet 320 is mounted coaxially on a rotary input shaft 321. First and second pole pieces 324 and 325, respectively, abut opposite ends of the magnet 320. Both the first and second pole pieces 324 and 325 have helical lips 330 and 340 forming a single turn around the respective pole pieces 324 and 325. The helical lips 330 and 340 twist in the same sense as each other from respective first ends to respective second ends. The depth of the lips 330 and 340 is substantially constant over a central portion of each lip and tapers to zero at the ends. The second end of the first lip 330 is adjacent the first end of the second lip 340.

A Hall effect device 342 is positioned such that it can measure the magnetic flux between the lips 330 and 340. Rotation of the input shaft 321 causes the pole pieces 324 and 325, and the lips 330 and 340 to rotate. As the lips 330 and 340 rotate, the distance from each lip 330 and 340 to the Hall effect device 342 varies cyclically.

In the arrangement shown in FIG. 20, the first lip 330 acts as a North pole and the second lip 340 acts as a South pole. Thus rotation of the lips causes relative movement of the Hall effect device 342 between opposing magnetic poles. The magnetic field at the Hall effect device varies with the rotation of the lips 330 and 340.

The profile of the lips may be altered to control the response characteristic of the transducer, for example sinusoidal or linear responses, square or square root or arbitrary response characteristics may be selected. In the embodiment shown in FIG. 20, the response is substantially linear while one lip is closer to the Hall effect device 342 that the other lip. However the transducer deviates from a linear response when the Hall effect device 342 is near to the ends of the lips.

A further pole piece 343 may be positioned adjacent the Hall effect device 342, to concentrate the magnetic field at the Hall effect device 342.

The magnetic field sensors, such as Hall effect devices, may be arranged in pairs to give complementary outputs. Alternatively sensors may be used that have complementary outputs, for example a 634SS2 linear Hall effect device.

Figure 21:
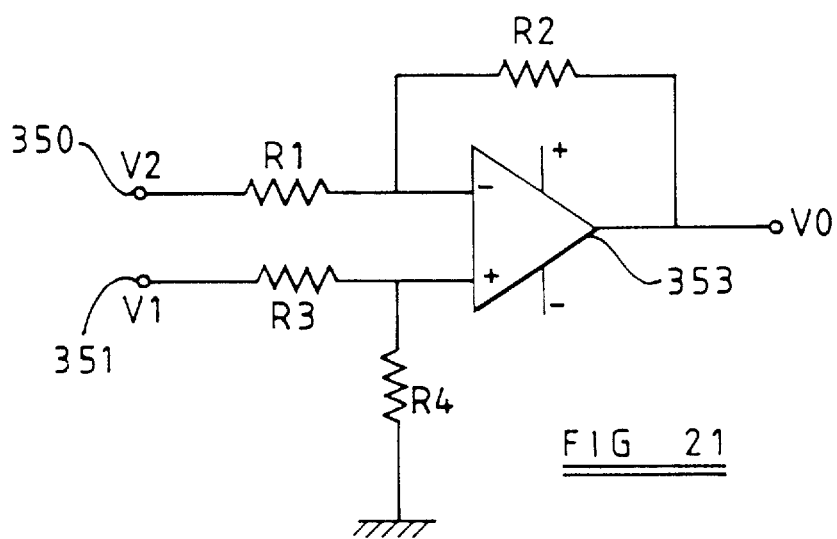
FIG. 21 is a circuit diagram of a circuit suitable for use with transducers having two magnetic flux or field sensors arranged to have differential outputs.

FIG. 21 shows an amplifier circuit suitable for use with devices having differential outputs, or for a pair of devices whose outputs are to be treated as being differential. An inverting input 350 is connected via a resistor R1 to an inverting input of an operational amplifier 353. A non-inverting input 351 is connected via a resistor R3 to a non-inverting input of the operational amplifier 353. A feedback resistor R2 is connected between the inverting input and an output of the operational amplifier 353. The non-inverting input is connected to ground via a resistor R4.

If the voltage at the input 350 is $V_2$ and the voltage at the input 351 is $V_1$, then the output voltage $V_0$ can be found from:

$$V_0 = -R2/R1 \left[ V_2 - \frac{v_1}{R3/R4 + 1} \left( \frac{R1}{R2} + 1 \right) \right]$$

If R1/R2=R3/R4, then this simplifies to $$V_0 = R2/R1 \; (V_1 - V_2)$$

Additionally, an offset may be applied if required. This may be achieved by connecting resistor R4 to a voltage source instead of ground.

It is thus possible to provide transducers that use magnetic sensors and magnets to measure position. The transducers can be used to measure slowly changing positions. They are robust. The use of solid state Hall effect devices enables the transducers to be used in potentially explosive environments. The absence of physically contacting electromechanical devices such as linear potentiometers gives improved reliability and stability with age.

We claim:

1. A joystick controller comprising, in combination:

a support;

a resilient control arm rigidly connected to said support and arranged to flex under the action of an applied force, said resilient control arm having a region which is held in use; and, at least one sensor for measuring the flexure of said control arm;

wherein said at least one sensor includes (i) a tube which is secured to said control arm adjacent to said region of said control arm and (ii) a sensor member mounted for movement with the control arm on said tube.

2. A joystick controller as claimed in claim 1, wherein said sensor is arranged to tilt about a point intermediate the ends of the control arm when the control arm is flexed.

3. A joystick controller as claimed in claim 2, wherein said point is located within the volume of the sensor member.

4. A joystick controller as claimed in claim 2, wherein said point is located substantially at the center of the sensor member.

5. A joystick controller as claimed in claim 2, wherein limiting means are provided for limiting flexing movement of said resilient control arm about said point.

6. A joystick controller as claimed in claim 5, wherein said limiting means comprises a tapered wall of a body member relative to which the resilient control arm can flex.

7. A joystick controller as claimed in claim 1, wherein said at least one sensor comprises a magnet and a sensor element responsive to a magnetic field.

8. A joystick controller as claimed in claim 7, wherein the sensor element operates using the Hall effect principle.

9. A joystick controller as claimed in claim 7, wherein a single magnet is used with a plurality of sensor elements to form a plurality of sensors.

10. A joystick controller as claimed in claim 6, wherein there are four sensor elements spaced substantially equally around the control arm in an array of opposing pairs of sensor elements, opposing sensor elements of each pair being grouped together to measure flexure along an axis.

11. A joystick controller as claimed in claim 1, further including at least one manually operable member which is movable independently of the control arm, and at least one further sensor for measuring movement of said at least one member whereby at least one additional parameter can be controlled by the controller.

* * * * *